(12) United States Patent
Fukui et al.

(10) Patent No.: US 6,420,644 B1
(45) Date of Patent: Jul. 16, 2002

(54) SOLAR BATTERY AND METHOD OF TREATING A BOARD FOR A SOLAR BATTERY

(75) Inventors: Atsushi Fukui; Keisuke Kimoto, both of Kitakyushu (JP)

(73) Assignee: Mitsui High-tec, Inc., Kitakyushu (JP)

( * ) Notice: Subject to any disclaimer, the term of this patent is extended or adjusted under 35 U.S.C. 154(b) by 0 days.

(21) Appl. No.: 09/723,042

(22) Filed: Nov. 27, 2000

(30) Foreign Application Priority Data

Nov. 26, 1999 (JP) ............................................ 99-336789

(51) Int. Cl.⁷ ...................... H01L 31/042; H01L 31/048
(52) U.S. Cl. ...................... 136/250; 136/256; 136/245; 136/251; 136/258; 136/244; 438/71; 438/72; 438/63; 438/96; 438/66; 438/69; 427/74; 427/585; 427/588; 257/53; 257/466; 257/436
(58) Field of Search .................... 136/250, 256, 136/245, 251, 258, 244; 438/71, 72, 63, 96, 66, 69; 427/74, 585, 588; 257/53, 466, 436

(56) References Cited

U.S. PATENT DOCUMENTS

| 4,407,320 A | * | 10/1983 | Levine ........................ 136/250 |
| 5,081,069 A | * | 1/1992 | Parker et al. .................. 438/72 |
| 5,785,768 A | * | 7/1998 | Nakata ........................ 136/250 |
| 6,156,968 A | * | 12/2000 | Nishimoto et al. ......... 136/252 |
| 6,180,870 B1 | * | 1/2001 | Sano et al. .................. 136/258 |
| 6,281,427 B1 | * | 8/2001 | Mitsuhiro et al. .......... 136/250 |

FOREIGN PATENT DOCUMENTS

JP 62-45079 A * 2/1987

* cited by examiner

Primary Examiner—Alan Diamond
(74) Attorney, Agent, or Firm—Wood, Phillips, Katz, Clark & Mortimer

(57) ABSTRACT

A solar battery having a board with a surface with a plurality of spherical segments projecting from the board surface. A primary electrode layer is provided on the board surface and the plurality of spherical segments. A semiconductor layer is provided on the primary electrode layer and has P-N connecting members. A secondary electrode layer on the semiconductor layer is made up of a translucent material.

43 Claims, 5 Drawing Sheets

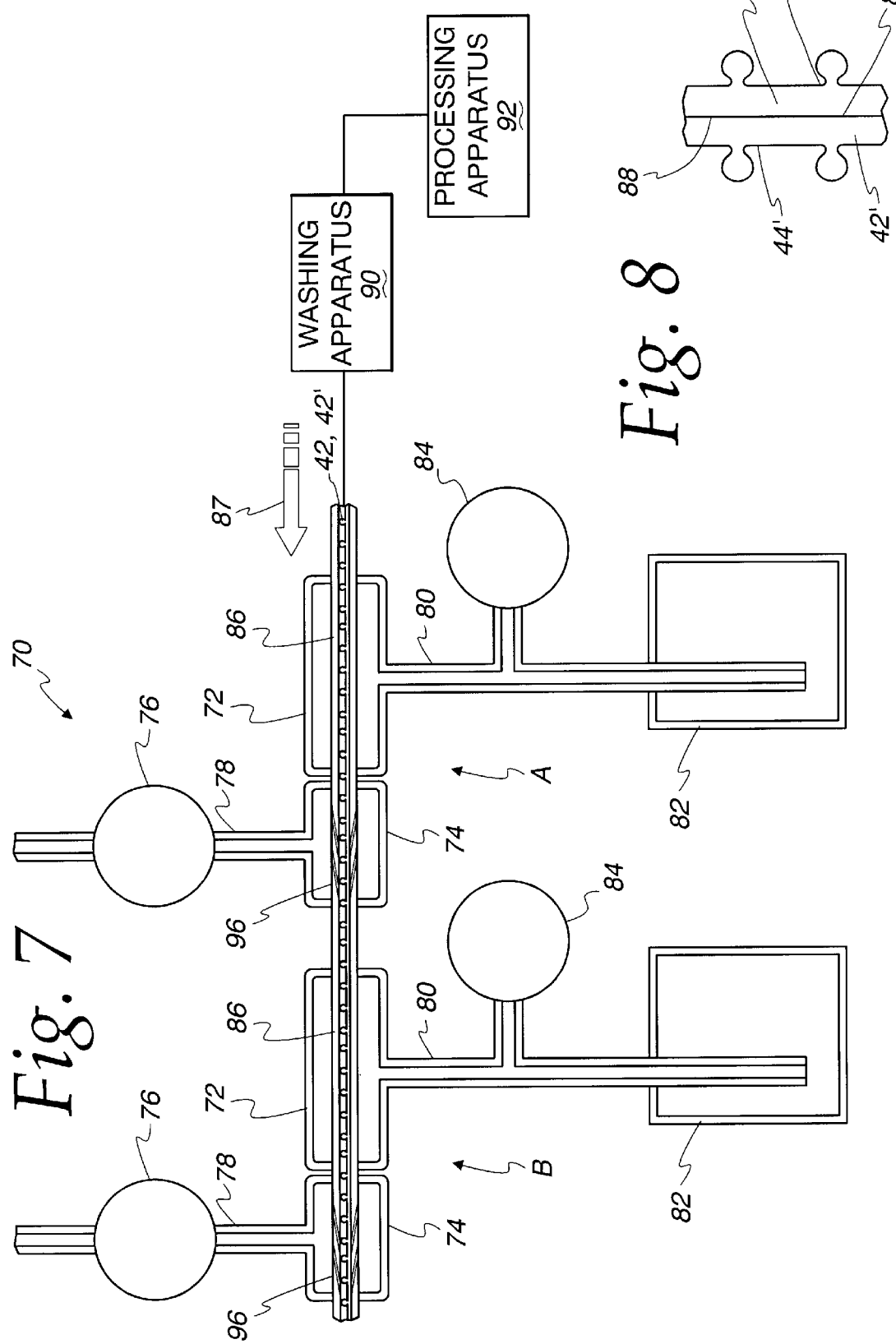

SOLAR BATTERY AND METHOD OF TREATING A BOARD FOR A SOLAR BATTERY

BACKGROUND OF THE INVENTION

1. Field of the Invention

This invention relates to solar batteries of the type having a board with a surface and a plurality of spherical segments projecting from the board surface. The invention is also directed to a method of treating a board for a solar battery.

2. Background Art

In a conventional solar battery, an internal electrical field is generated between P-N connecting members of a semiconductor layer. Impingement of light upon the solar battery develops electron/electron hole pairs. The electrons collect on the N side, with the electron holes formed on the P side. With an external load connected, electric current flows from the P side toward the N side. Through this process, solar batteries are able to convert light energy into usable electrical energy.

In recent years, solar batteries have been made using spherical semiconductors. Spherical semiconductors typically have a diameter of less than 1 mm and may be made from single crystals, or the like. Circuit patterns are formed on the surfaces of the spherical semiconductors.

An example of a conventional solar battery using spherical semiconductors is shown in FIG. 15 at 10. The solar battery 10 consists of an array of spherical semiconductors 12 which are connected together utilizing a conductive board 14, which in this case is shown to be aluminum foil, or the like. Each of the spherical semiconductors 12 has a primary conductive skin 16 which envelops a secondary conductive core 18. The spherical semiconductors 12 are placed in an opening 20 in the conductive board 14 so as to project from opposite sides 22 and 24 of the board 14. A portion of the skin 16 is removed from the spherical semiconductor 12 on the side 24 of the board 14. An insulating layer 26 is formed against the core 18 which is exposed where the external skin 16 is removed. A portion of the core 18 and insulating layer 26 is removed at 28 so as to form a flat surface 30 which can be connected to a secondary conductive member 32, which in this case is aluminum foil. The surface 30 is connected in a high quality, ohmic manner to the conductive member 32.

It is difficult to maintain a precise relationship between the semiconductors 12 and the conductive board 14, insulating layer 26, and secondary conductive member 32 throughout the entire area of the solar battery 10. Variation in the relationship of these elements may alter the operating characteristics of the semiconductors 12 and the performance of the battery 10.

Additionally, the manufacture of the solar battery 10 may involve multiple steps and processes. Manufacture may thus be relatively complicated. As a result, the costs attendant such manufacture may also be high.

SUMMARY OF THE INVENTION

In one form, the invention is directed to a solar battery having a board with a surface with a plurality of spherical segments projecting from the board surface. A primary electrode layer is provided on the board surface and the plurality of spherical segments. A semiconductor layer is provided on the primary electrode layer and has P-N connecting members. A secondary electrode layer on the semiconductor layer is made up of a translucent material.

In one form, the semiconductor layer is directly against the primary electrode layer and the secondary electrode layer is directly against the semiconductor layer.

The plurality of spherical segments may be arranged in rows.

The board may be made from an insulative material, such as glass or resin.

The board may be sufficiently flexible to be placed into a rolled form.

The board made be made from a conductive material, such as copper. In one form, the board is made from metal that defines the primary electrode layer.

The primary electrode layer may be made from chrome having a thickness on the order of 1 $\mu$m.

The secondary electrode layer may be made from transparent indium tin oxide (ITO).

The semiconductor layer may include a positive amorphous silicon layer and a negative amorphous silicon layer.

The spherical segments may be formed as one piece with the board or separately placed on the board.

In one form, the spherical segments are each part of a sphere having a diameter on the order of 1 mm.

In the event a metallic board is used, a contact metallic layer may be placed on the metallic board under the secondary electrode layer. The contact metallic layer may be Ni—Au.

The board surface may be embossed to define the plurality of spherical segments.

The positive and negative amorphous silicon layers may be formed using a CVD method.

The positive amorphous silicon layer may be formed through thermal decomposition using a silane mixture containing boron.

The negative amorphous silicon layer may be formed through thermal decomposition using a silane mixture containing phosphorous.

The secondary electrode layer may be applied using a sputtering method.

The board may be made from a polyimide film.

A collector may be provided over the secondary electrode layer between the spherical segments.

The invention is also directed to a method of treating a board for a solar battery. The method includes the steps of directing a first board having a surface with a plurality of spherical segments projecting from the first board surface through a first chamber containing a first reactive gas and directing the reactive gas at the first board in a plurality of directions in the first chamber to form a first layer on the board surface and the spherical segments.

The first board may be joined with a second board having a plurality of spherical segments projecting from the second board surface. The second board may be directed together with the first board through the first chamber so that reactive gas is directed at the second board in a plurality of directions in the first chamber.

In one form, each of the first and second boards has a back surface, facing oppositely to its respective surface with the plurality of projecting spherical segments thereon. The step of joining the first board with the second board may involve joining the back surfaces of the first and second boards.

The method may further include the steps of directing the first board into a second chamber and drawing the first reactive gas out of the second chamber.

The step of drawing the first reactive gas out of the second chamber may involve generating a low pressure region outside of the second chamber and drawing the first reactive gas from the second chamber into the low pressure region.

The method may further include the steps of directing the first board into a third chamber containing a second reactive gas after directing the first board into the second chamber and directing the second reactive gas at the first board in the third chamber to form a second layer over the first layer.

The first layer may be at least a part of a semiconductor layer.

The first board may be passed through a first conduit in the first chamber. The first conduit has a central axis and a peripheral wall with openings therethrough through which the first gas passes as it is directed against the first board.

The method may further include the step of directing the first reactive gas around the central axis as the first reactive gas is directed at the first board.

The plurality of openings in the peripheral wall may have central axes that are non-parallel to the central axis of the first conduit.

In one form, the first board moves in a first direction through the first chamber and at least one of the plurality of openings is oriented so that the first gas is directed generally in the first direction.

The first board may be passed through a second conduit in the second chamber with the second conduit being made from a porous material.

In one form, the first board is flexible. The method may include the step of placing the first board into a rolled form.

The first layer may be made from a positive amorphous silicon.

The first layer may be made from a negative amorphous silicon.

In one form, the porous material is produced through sintering of at least one of ceramic, resin and metallic powder.

BRIEF DESCRIPTION OF THE DRAWINGS

FIG. 7 is an elevation view of a system for forming the layers on the board in FIG. 3 to produce the solar battery of FIGS. 1 and 2;

FIG. 8 is an enlarged, fragmentary, cross-sectional view of two boards as in FIG. 3 which are joined to be processed simultaneously and in a continuous fashion through the system in FIG. 7;

DETAILED DESCRIPTION OF THE DRAWINGS

Figure 1:
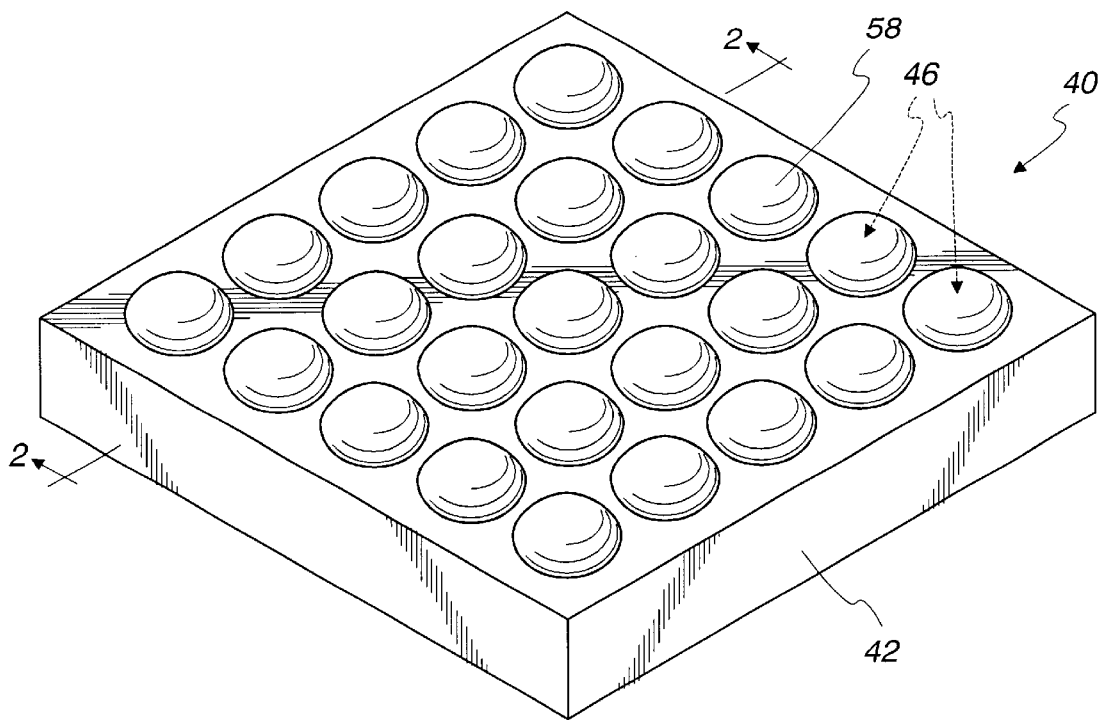
FIG. 1 is perspective view of a solar battery made according to the present invention.
Figure 2:
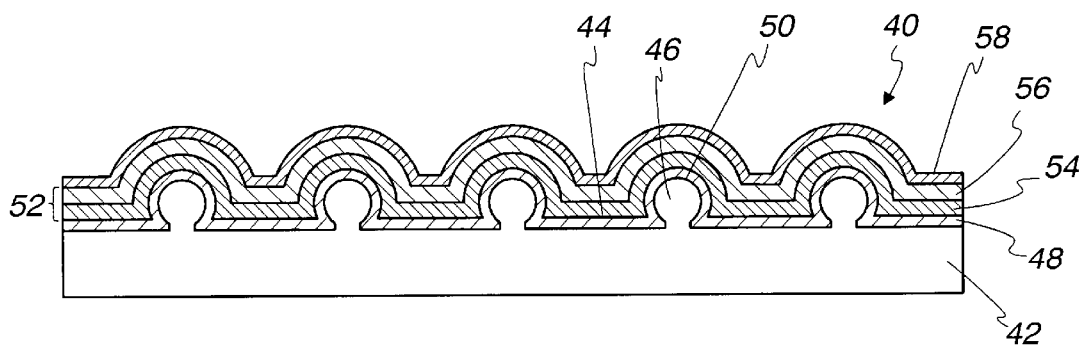
FIG. 2 is a cross-sectional view of the solar battery taken along line 2—2 of FIG. 1.

Referring initially to FIGS. 1 and 2, one form of solar battery, according to the present invention, is shown at 40. The solar battery 40 consists of a board 42 having a surface 44 and a plurality of spherical segments 46 projecting from the board surface 44. In this embodiment, the board 42 and spherical segments 46 are made from a heat resistant glass material which may be sufficiently rigid so as to be shape retentive. The spherical segments 46 can be separately bonded to the surface 44, but are preferably formed as one piece with the remainder of the board 42. The spherical segments 46 are each part of a sphere having a diameter of approximately 1 mm.

A bottom, primary electrode layer 48 is applied to the surface 44 and the exposed surfaces 50 of the spherical segments 46. The layer 48 has a thickness of approximately 1 $\mu$m and is made from chrome.

A semiconductor layer 52 is applied to the bottom electrode layer 48 and consists of a positive amorphous silicon layer 54 applied to the bottom electrode layer 48 and a negative amorphous silicon layer 56 applied to the positive amorphous silicon layer 54. An upper, secondary electrode layer 58, is made from a light transmitting material. In this embodiment, the upper electrode is made of transparent indium tin oxide (ITO), is applied to the negative amorphous silicon layer 56.

The extraction of the primary and secondary electrode layers 48, 58 is not shown. However, the bottom electrode layer 48, by reason of being chrome, has a low resistance, and as such extraction from one or both ends is adequate. The upper electrode layer 58, which is a transparent conductive layer, should be extracted from as many places as possible.

In this structure, the board 42, which may be made with the glass material previously described, or a resin material, has positively located spherical segments 46. By reason of the stable and consistent location of the spherical segments 46, the only significant variation in the characteristics of the solar battery 40 would be attributable to the variations in the layers 48, 54, 56, 58 applied to the board 42. Thus, the inventive structure permits manufacture of a solar battery 40 with predictable quality and operating characteristics. At the same time, the structure of the solar batteries 40 facilitates manufacture and mounting thereof.

Figure 3:
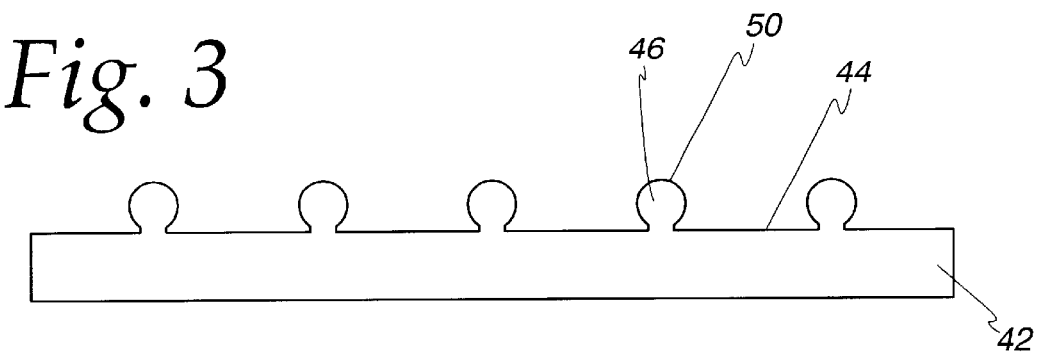
FIG. 3 is a cross-sectional view of a board used to construct the solar battery in FIGS. 1 and 2.
Figure 4:
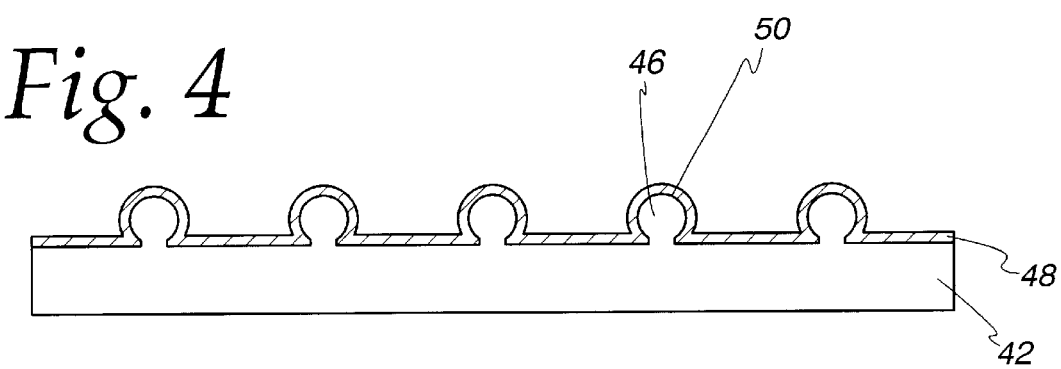
FIGS. 4–6 are views as in FIG. 3 and showing the sequential formation of layers upon the board to produce the solar battery in FIGS. 1 and 2.

Manufacturing steps will now be explained sequentially with respect to FIGS. 3–6. In FIG. 3, the board 42 is shown with the spherical segments 46 permanently located thereon so as to project from the board surface 44. The structure is initially washed and then rinsed to purge all washing materials.

The chrome primary electrode layer 48 is then applied to the surface 44 and over the exposed surfaces 50 of the spherical segments 46. The chrome may be applied using a vacuum disposition process.

Figure 5:
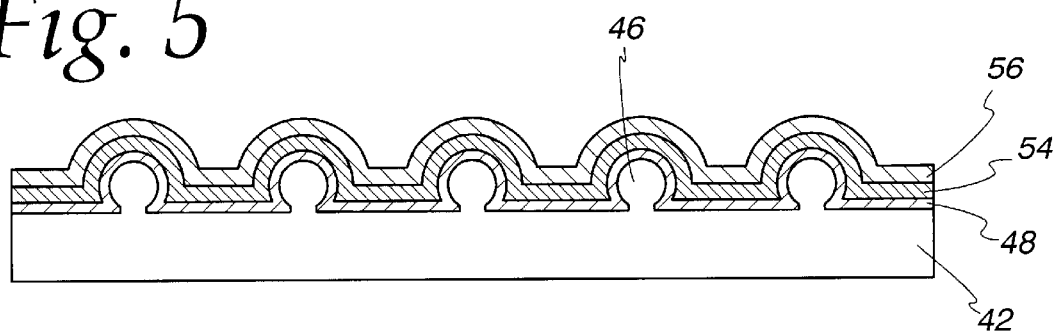

As shown in FIG. 5, the positive amorphous silicon layer 54 and negative amorphous silicon layer 56 are then applied to the chrome electrode layer 48, as by a CVD process. Each layer 54, 56 is produced through thermal decomposition, using in the case of the positive amorphous silicon layer 54 a silane mixture of gas containing boron, and in the case of the negative amorphous silicon layer 56 a silane mixture of gas containing phosphorous.

Figure 6:
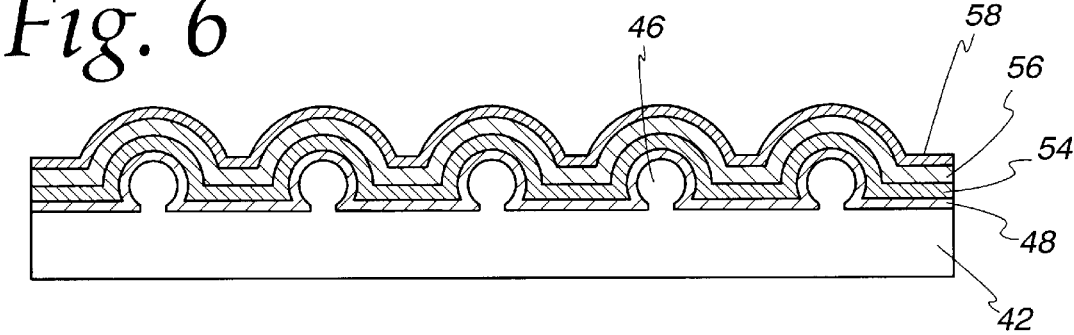

Then, as shown in FIG.6, a 1 μm thickness ITO electrode layer 58 is applied to the entire exposed surface of the solar battery 40 using a sputtering method. Particles are extracted and formed on the surface of the ITO upper electrode layer 58 using a pump, or the like. Particles are extracted to the bottom electrode layer 48.

The CVD process and vacuum disposition process may be carried out using a system as shown at 70 in FIG. 7. Through this system 70, formation of the various layers is carried out by directing the board 42 through different atmospheres with controlled reaction temperatures. The operation of the system 70 will be described in performing the layer application shown in FIGS. 4–6.

The system 70 consists of a series of paired chambers 72, 74. The chamber 72 is a collection chamber, with the chamber 74 being a reaction chamber.

A reactive gas from a supply 76 is communicated to the space within the reaction chamber 74 through a conduit 78.

The space within the collection chamber 72 communicates through a conduit 80 to a collection tank 82. A collection pump 84 generates low pressure/vacuum within the conduit 80 and chamber 72. The collection tank 82 is cooled to a set temperature.

A conduit 86, made of porous material, passes through the collection chamber 72. The porous material may be material produced through the sintering of ceramic, resin, or metallic powder. By reason of the aforementioned pressure differential, gas within the collection chamber conduit 86 is drawn from within the conduit 86 through the porous material for accumulation in the collection tank 82.

The boards 42 are delivered from right to left in the system in FIG. 70, as indicated by the arrow 87, going serially through each matched pair of chambers 72, 74. To enhance processing efficiency, the boards 42 may be joined in pairs and passed simultaneously through the system 70. As shown in FIG. 8, the board 42 has a back surface 88 which can be abutted to a corresponding back surface 88', facing oppositely to a surface 44', on a correspondingly configured board 42'. The boards 42, 42', which are held together by any appropriate means, are then moved as one piece through the system 70.

Returning again to FIG. 7, the process is started by preparing the boards 42, 42' by washing through an appropriate apparatus 90 and by performing other processing as may be appropriate and known to those skilled in the art, as by using an apparatus 92. The prepared boards 42, 42' are then advanced in the direction of the arrow 87 into the collection chamber 72. In the chamber 72, the wash and rinse medium, which may be gas, is drawn from the boards 42, 42' through the collection chamber conduit 86 to the collection tank 82. The prepared boards 42, 42' are then directed to the reaction chamber 74 for passage through the conduit 96 therewithin. In the reaction chamber 74, the boards 42, 42' are exposed to the reactive gas in the supply 76. The reaction chamber at 74 is preferably maintained at a temperature to conduct efficient treatment of the boards 42, 42' with the reactive gas.

Figure 9:
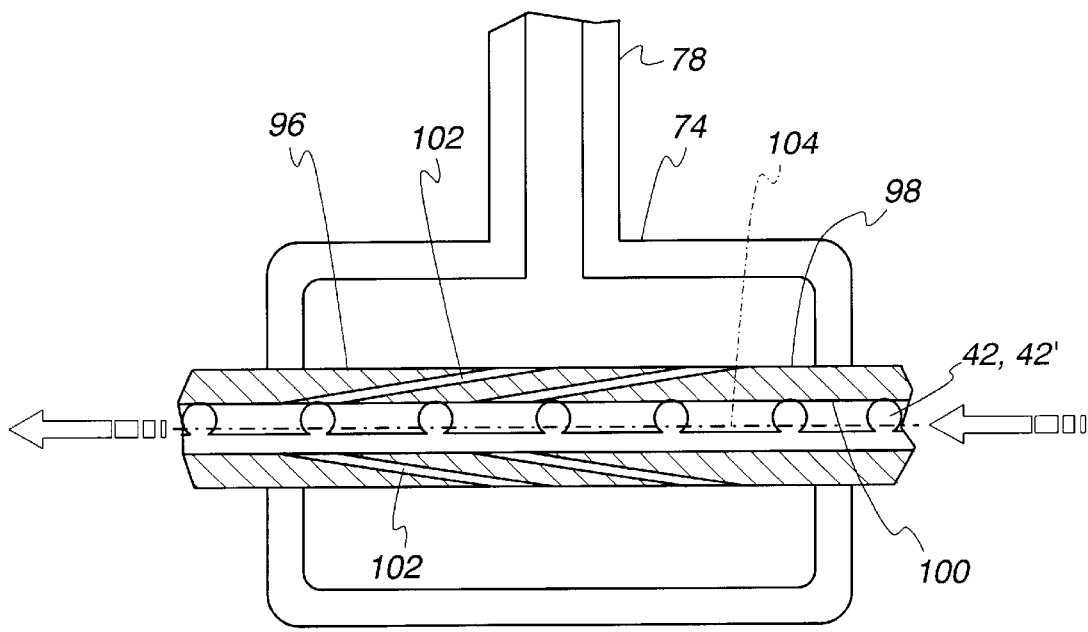
FIG. 9 is an enlarged, fragmentary cross-sectional view of a reaction chamber on the system in FIG. 7 in which reactive gas is supplied to the boards during the manufacturing process.

As seen further in FIG. 9, the conduit 96 has a peripheral wall 98 bounding a passageway 100 through which the boards 42, 42' are passed. The wall 98 has a series of circumferentially spaced openings 102 extending through the peripheral wall 98 and extending non-orthogonally to the central axis 104 of the conduit 96. The openings 102 may be straight or extend spirally around the axis 104. Preferably, the gas is introduced into the passageways 100 in the same direction of movement as the boards 42, 42' through the system 70. As a result, the reactive gas may be propelled into the reaction chamber conduit 96 at high speeds around the axis 104.

The angle and number of the openings 102 are selected so that the reactive gas fully envelops the boards 42, 42' with a gas flow that potentially produces a uniform layer thickness. While one construction for these passageways 100 is shown, virtually any arrangement of passageways, or use of porous material, that will effectively immerse the boards 42, 42' in the reactive gas will suffice.

Through exposure to the reactive gases, the layers of the solar battery 40 can be sequentially built upon the boards 42, 42'. After processing in the matched pair of chambers 72, 74 at A, a similar process is carried out in the matched pair of chambers 72, 74 at B in FIG. 7. Any additional number of the matched pair of chambers 72, 74 can be utilized with appropriate type and number of reactive gases.

As an alternative to making the collection chamber conduit 86 from a porous material, openings may be provided therethrough. Similarly, the reaction chamber conduit 96 may be made from the same material as the collection chamber conduit 86. For example, the collection chamber conduit 86 may be ceramic, resin, metal, or resin-coated so that both an active gas, water, and the like may be transported therethrough.

With the above arrangement, the atmosphere from each preceding processing zone is exhausted from the collection chamber conduits 86 for accumulation in the collection tanks 82. The atmosphere developed in each reaction chamber 74 is not mixed with the atmosphere from the upstream reaction chamber 74. Using an arrangement of four different reaction chamber conduits 96 (two shown in FIG. 7) in FIG. 7, four different reactive gases can be directed at the boards 42, 42' without mixing of the gases as the boards 42, 42' move from one chamber 74 to the next, to apply a corresponding number of layers to produce the solar battery 40.

More specifically, the most upstream reaction chamber 74 is supplied with a reactive gas consisting of an evaporation source containing chrome to produce the layer 48. The next reaction chamber 74 is supplied with a reactive gas that is a silane gas mixture containing boron, which is introduced at a controlled temperature to produce the positive amorphous silicon layer 52. In the next chamber 74, the boards 42, 42' are exposed to a silane gas mixture containing phosphorous to produce the negative amorphous silicon layer 56. Finally, in the most downstream chamber 74, the boards 42, 42' are exposed to an evaporation source containing indium tin oxide (ITO) to produce the layer 58.

The boards 42, 42' can be transported individually or joined to move simultaneously in a continuous manner through the system 70. As noted above, the reactive gas atmospheres will be isolated, one from the other. Various treating environments, such as active gas, inactive gas, water, and various solutions, can be provided for treatment without intermixing thereof. The formation of the semiconductor layer may be effected by depositing a conductive amorphous silicon layer or by forming an impurity scattering layer using diffusion, thereby facilitating manufacture of a battery with a high quality amorphous silicon layer on a large area of a board made from insulting material. At the same time, the boards 42, 42' can be isolated from the outside environment in the conduits 86, 96. This contributes to the production of a highly reliable solar battery with predictable performance characteristics.

The silicon surfaces are easy to oxidize. In the event that a layer is formed thereon using natural oxidation, while the connection with an electrode layer formed thereon may not be strong, there is no exposure to the outside atmosphere and transportation and processing may be carried out in a sealed space.

Figure 10:
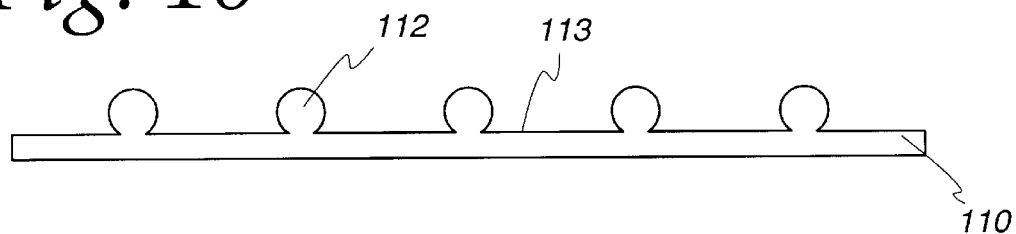
FIG. 10 is a cross-sectional view of another form of board, made according to the present invention and upon which layers are serially applied to produce a solar battery.
Figure 11:
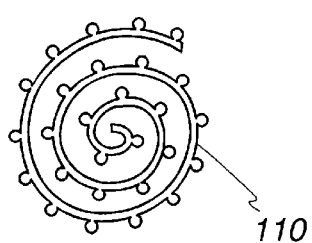
FIG. 11 is a schematic representation of a board as in FIG. 10 that is flexible and reconfigured to a rolled form.

A modified form of board, according to the present invention, is shown at 110 in FIG. 10. The board 110 consists of flexible polyimide film with a plurality of 1 mm glass spherical segments 112 on the surface 113 thereof. The various electrode and semiconductor layers applied thereto may correspond to those previously described. By reason of using a flexible board construction, the board 110 lends itself to being placed in a continuously rolled form, shown schematically in FIG. 11, either before, during, or after processing. That is, the board material can be drawn from a roll and/or rolled at completion of processing, or during an intermediate processing step for the solar battery made from the board 110.

Figure 12:
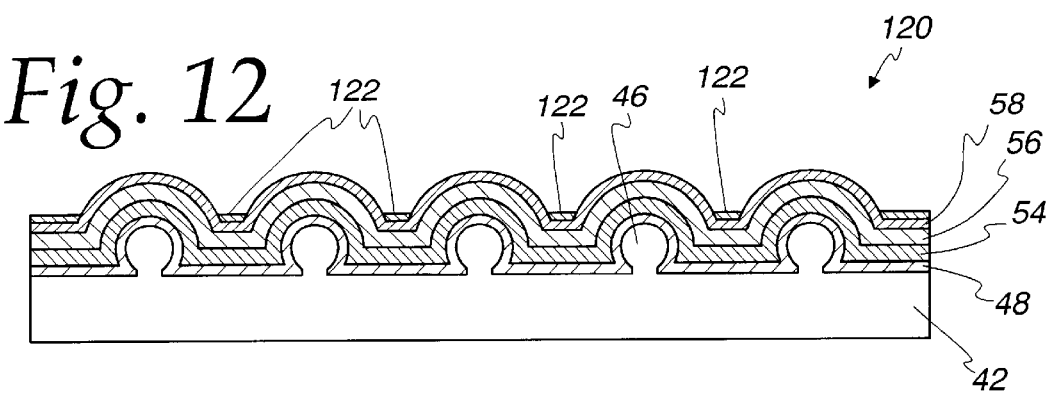
FIG. 12 is a cross-sectional view of another form of solar battery, made according to the present invention.

In FIG. 12, another form of solar battery, according to the invention, is shown at 120. The solar battery 120 has the same basic construction as the solar battery 40 shown in FIG. 2, with corresponding components and layers numbered in like fashion. The only difference between these two solar batteries is that in FIG. 12, a collector 122 overlies the upper electrode layer 58 between the spherical segments 46. The regions between the spherical segments 46, which are not easily accessed by light, function as collectors to reduce the light receiving surface area, thereby providing an efficient solar battery.

Figure 13:
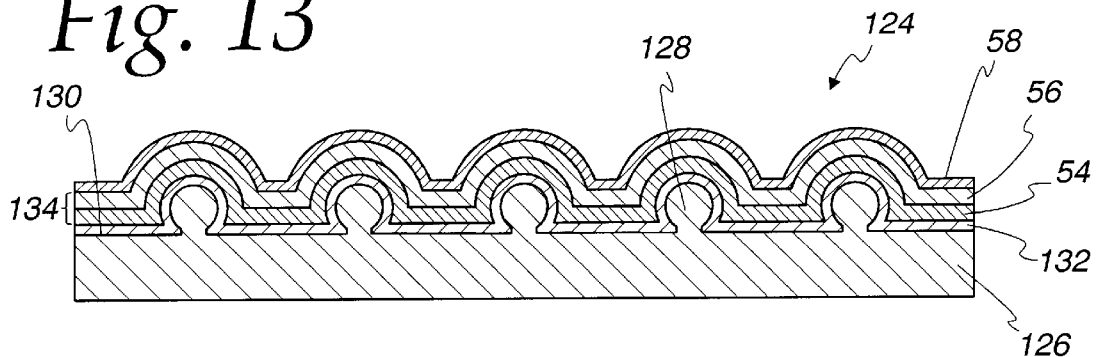
FIG. 13 is a view as in FIG. 12 of another form of solar battery, made according to the present invention.

A further form of solar battery, according to the present invention, is shown at 124 in FIG. 13. In this embodiment, the board 126, corresponding to the board 42, is made from metal, and in this case copper. Spherical segments 128 project from the board surface 130. By reason of making the board from metal, the need for a bottom electrode layer, corresponding to the layer 48, is obviated. Amorphous silicon containing P-N connecting members through an Ni—Au layer, is formed as a contact metallic layer 132 on the board 126. The semiconductor layer 134 may be made the same as the semiconductor layer 52, previously described, to include the positive amorphous silicon layer 54 and negative amorphous silicon layer 56. Similarly, the upper electrode layer 58 may be the same as that previously described.

In this construction, the conductive board 126 acts as a collector to reduce the resistance of the electrode, thereby permitting construction of a reliable solar battery with low resistance. A strong ohmic connection can be established between the metal and the semiconductor layer 52, to enable a relatively strong electromotive force to be developed. This construction also lends itself to facilitated manufacture and mounting of a battery with potentially a large surface area.

Figure 14:
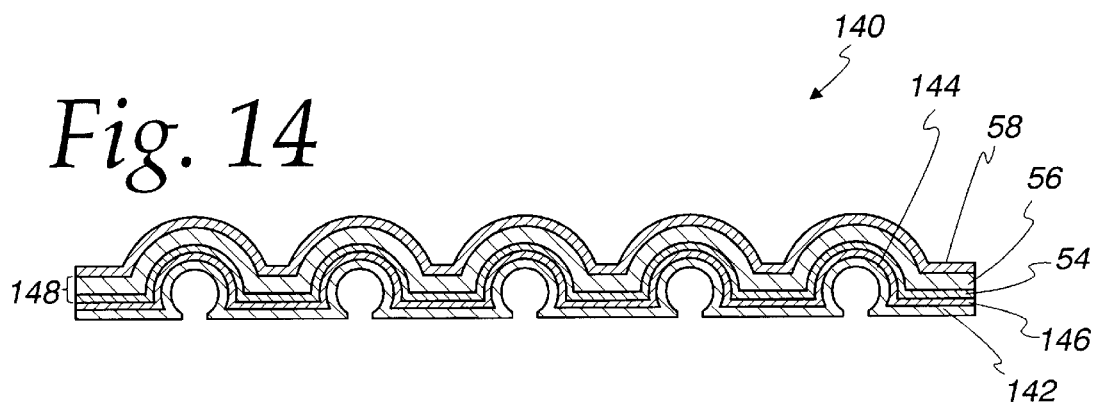
FIG. 14 is a view as in FIGS. 12 and 13 of a still further form of solar battery, according to the present invention.
Figure 15:
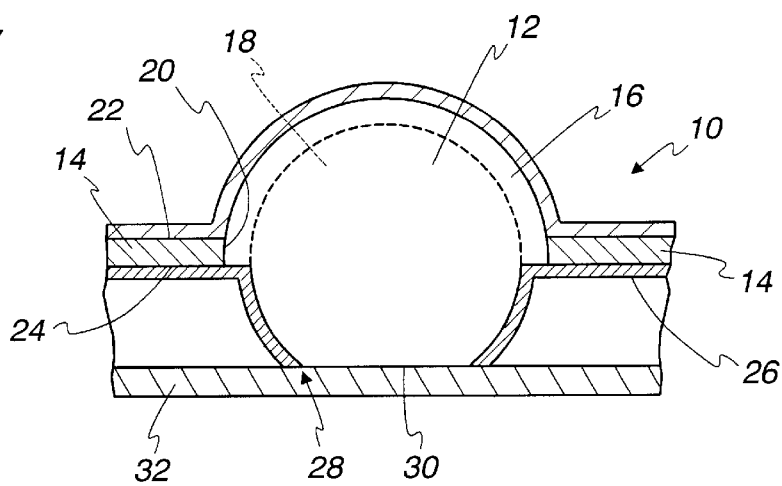
FIG. 15 is a fragmentary, cross-sectional view of a conventional solar battery made using spherical semiconductors.

A still further solar battery, according to the present invention, is shown at 140 in FIG. 14. The solar battery 140 consists of a board 142 made from copper with spherical segments 144 embossed thereon. Accordingly, the spherical segments 144 have a hollow construction. Again, the need for an electrode layer, corresponding to the layer 48, is obviated. An amorphous silicon containing P-N connecting members through an Ni—Au layer 146, corresponding to the layer 132, is applied to the board 142. A semiconductor layer 148 is applied to the layer 146 and includes the amorphous silicon layers 54, 56, previously described. The translucent electrode layer 58 is applied to the semiconductor layer 148.

The foregoing disclosure of specific embodiments is intended to be illustrative of the broad concepts comprehended by the invention.

What is claimed is:

1. A solar battery comprising:
    a board having a surface with a plurality of spherical segments projecting from the board surface at preselected locations;
    a primary electrode layer on the board surface and the plurality of spherical segments;
    a semiconductor layer on the primary electrode layer and comprising P-N connecting members; and
    a secondary electrode layer comprising a light transmitting material on the semiconductor layer.

2. The solar battery according to claim 1 wherein the semiconductor layer is directly against the primary electrode layer and the secondary electrode layer is directly against the semiconductor layer.

3. The solar battery according to claim 2 wherein the plurality of spherical segments are arranged in rows.

4. The solar battery according to claim 3 wherein the board comprises an insulative material.

5. The solar battery according to claim 1 wherein the board comprises glass.

6. The solar battery according to claim 1 wherein the board comprises resin.

7. The solar battery according to claim 1 wherein the board is sufficiently flexible to be placed into a rolled form.

8. The solar battery according to claim 6 wherein the board is sufficiently flexible to be placed into a rolled form and the plurality of spherical segments are placed on the flexible resin board.

9. The solar battery according to claim 1 wherein the board comprises a conductive material.

10. The solar battery according to claim 1 wherein the board comprises metal that defines the primary electrode layer.

11. The solar battery according to claim 4 wherein the primary electrode layer comprises chrome.

12. The solar battery according to claim 11 wherein the chrome primary electrode layer has a thickness of approximately 1 $\mu$m.

13. The solar battery according to claim 1 wherein the plurality of spherical segments are each part of a sphere having a diameter of approximately 1 mm.

14. The solar battery according to claim 1 wherein the secondary electrode layer comprises indium tin oxide (ITO).

15. The solar battery according to claim 1 wherein the semiconductor layer comprises a positive amorphous silicon layer and a negative amorphous silicon layer.

16. The solar battery according to claim 1 further comprising a collector over the secondary electrode layer between the spherical segments.

17. The solar battery according to claim 1 wherein the plurality of spherical segments are formed as one piece with the board.

18. The solar battery according to claim 10 further comprising a contact metallic layer on the metal board under the secondary electrode layer.

19. The solar battery according to claim 18 wherein the contact metallic layer comprises Ni—Au.

20. The solar battery according to claim 10 wherein the board surface is embossed to define the plurality of spherical segments.

21. The solar battery according to claim 20 wherein the board comprises copper.

22. The solar battery according to claim 21 further comprising a contact metallic layer on the metal board under the secondary electrode layer.

23. The solar battery according to claim 15 wherein the positive and negative amorphous silicon layers are formed using a CVD method.

24. The solar battery according to claim 23 wherein the positive amorphous silicon layer is formed through thermal decomposition using a silane mixture containing boron.

25. The solar battery according to claim 23 wherein the negative amorphous silicon layer is formed through thermal decomposition using a silane mixture containing phosphorous.

26. The solar battery according to claim 14 wherein the secondary electrode layer is applied using a sputtering method.

27. The solar battery according to claim 1 wherein the board comprises a polyimide film that is sufficiently flexible to be placed into a rolled form.

28. A method of treating a board for a solar battery, said method comprising the steps of:
    directing a first board having a surface with a plurality of spherical segments projecting from the first board surface at preselected locations through a first chamber containing a first reactive gas; and
    directing the first reactive gas at the first board in a plurality of directions in the first chamber to form a first layer on the board surface and the spherical segments.

29. The method of treating a board for a solar battery according to claim 28 further comprising the steps of joining the first board with a second board having a surface with a plurality of spherical segments projecting from the second board surface, directing the second board with the first board through the first chamber, and directing the reactive gas at the second board in a plurality of directions in the first chamber.

30. The method of treating a board for a solar battery according to claim 29 wherein the first and second boards each have a back surface facing oppositely to its respective surface with the plurality of projecting spherical segments and the step of joining the first board with the second board comprises joining the back surfaces of the first and second boards.

31. The method of treating a board for a solar battery according to claim 28 further comprising the steps of directing the first board into a second chamber and drawing the first reactive gas out of the second chamber.

32. The method of treating a board for a solar battery according to claim 31 wherein the step of drawing the first reactive gas out of the second chamber comprises the steps of generating a low pressure region outside of the second chamber and drawing the first reactive gas from the second chamber into the low pressure region.

33. The method of treating a board for a solar battery according to claim 31 further comprising the steps of directing the first board into a third chamber containing a second reactive gas after directing the first board into the second chamber and directing the second reactive gas at the first board in the third chamber to form a second layer over the first layer.

34. The method of treating a board for a solar battery according to claim 28 wherein the first layer comprises at least a part of a semiconductor layer.

35. The method of treating a board for a solar battery according to claim 28 wherein the first board is passed through a first conduit in the first chamber and the first conduit has a central axis and a peripheral wall with openings therethrough through which the first gas passes as it is directed against the first board.

36. The method of treating a board for a solar battery according to claim 35 further comprising the step of directing the first reactive gas around the central axis as the first reactive gas is directed at the first board.

37. The method of treating a board for a solar battery according to claim 35 wherein a plurality of the openings in the peripheral wall have central axes that are non-parallel to the central axis of the first conduit.

38. The method of treating a board for a solar battery according to claim 37 wherein the first board moves in a first direction through the first chamber and at least one of the plurality of openings is oriented so that the first gas is directed generally in the first direction.

39. The method of treating a board for a solar battery according to claim 31 wherein the first board is passed through a second conduit in the second chamber and the second conduit comprises a porous material.

40. The method of treating a board for a solar battery according to claim 28 wherein the first board is flexible and further comprising the step of placing the first board into a rolled form.

41. The method of treating a board for a solar battery according to claim 28 wherein the first layer comprises a positive amorphous silicon layer.

42. The method of treating a board for a solar battery according to claim 28 wherein the first layer comprises a negative amorphous silicon layer.

43. The method of treating a board for a solar battery according to claim 40 wherein the porous material is produced through the sintering of at least one of ceramic, resin, and metallic powder.

* * * * *